(12) United States Patent
Yamamoto et al.

(10) Patent No.: US 6,388,921 B1
(45) Date of Patent: May 14, 2002

(54) NONVOLATILE SEMICONDUCTOR MEMORY DEVICE WITH IMPROVED RELIABILITY AND OPERATION SPEED

(75) Inventors: Yasuhiro Yamamoto; Tomoshi Futatsuya; Yoshikazu Miyawaki, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/695,224

(22) Filed: Oct. 25, 2000

(30) Foreign Application Priority Data

Apr. 28, 2000 (JP) ......................................... 2000-130835

(51) Int. Cl.[7] .............................................. G11C 16/04
(52) U.S. Cl. ................. 365/185.11; 365/185.2; 365/185.29
(58) Field of Search .......................... 365/185.11, 185.2, 365/185.29, 230.03

(56) References Cited

U.S. PATENT DOCUMENTS

| 5,450,360 A | * | 9/1995 | Sato |
| 5,809,553 A | * | 9/1998 | Choi et al. ........... 365/185.11 X |
| 5,920,504 A | * | 7/1999 | Lee et al. ............... 365/185.11 |

FOREIGN PATENT DOCUMENTS

| JP | 9-180482 | | 7/1997 |
| JP | 41088577 | * | 7/1998 |

* cited by examiner

*Primary Examiner*—Huan Hoang
(74) *Attorney, Agent, or Firm*—McDermott, Will & Emery

(57) ABSTRACT

A memory transistor for a lock bit, holding information on whether a memory block can be erased/reprogrammed, is provided in the same column as that of a plurality of dummy cells. Since a sub bit line for reading the lock bit is electrically isolated from a sub bit line for dummy cell, accurate lock-bit reading is possible even when the dummy cell is over erased. Thus, a nonvolatile semiconductor memory device advantageous in reliability and operation time can be provided.

17 Claims, 15 Drawing Sheets

PROGRAMMING OPERATION

PROGRAMMING OPERATION
(SELECTED CELL)

READING OPERATION
(CELL IN PROGRAMMED STATE)

READING OPERATION
(SELECTED CELL)

DISTRIBUTION OF Vth AFTER ERASING

Vg-Vd CHARACTERISTICS OF EACH
CELL AT Vth IN ERASED STATE

NONVOLATILE SEMICONDUCTOR MEMORY DEVICE WITH IMPROVED RELIABILITY AND OPERATION SPEED

BACKGROUND OF THE INVENTION

1. Field of the Invention

The present invention relates to a structure of a nonvolatile semiconductor memory device, enabling electrical programming/erasing of data and storage of information even when the power is off.

2. Description of the Background Art

In resent years, digital communication networks using portable information communication terminals such as a cellular phone or Internet have been developed, and nonvolatile semiconductor memory devices are widely used in such portable terminals as memory devices enabling nonvolatile storage of information.

One example of such nonvolatile semiconductor memory devices is an electrically programmable flash memory in which stored data can be electrically erased collectively for a group of a predetermined number of bits.

FIG. 9 is a schematic block diagram showing a configuration of a conventional nonvolatile semiconductor memory device 100.

Referring to FIG. 9, nonvolatile semiconductor memory device 100 includes a ROM (Read Only Memory) therein, a CPU 8 for controlling programming and erasing operations in response to a program code held in the ROM and a command signal applied from an external source, a high voltage generating circuit for programming/erasing 10 for generating a high voltage for programming and erasing from an external power potential (not shown), and a memory cell array 120.

Memory cell array 120 includes memory blocks 120-1 to 120-n formed in P wells electrically separated from one another. The erasing operation of nonvolatile semiconductor device 100 is performed for each of the memory blocks 120-1 to 120-n.

Nonvolatile semiconductor memory device 100 further includes an input buffer 2 for receiving from an external source an address signal ADD, a chip enable signal/CE, an output enable signal/OE, a write enable signal/WE and a reset signal/RP, WP input buffer 4 for receiving a write protect signal/WP from an external source, a WL decoder/WL driver 14 for selecting a memory block and a word line in response to a row address signal applied from input buffer 2, a data buffer 6 for transmitting/receiving a data signal DATA to/from an external source, a BL decoder/driver 16 for selecting a bit line in response to a column address applied from input buffer 2 to transmit/receive data between the selected bit line and data buffer 6, and a sense amplifier circuit 18 for reading data by detecting current flowing in the bit line at the time of a reading operation.

Memory block 120-1 includes a memory transistor MT for storing normal data arranged in rows and columns and a memory transistor MTL for lock bit holding information for protecting memory block 120-1 from programming/erasing.

Memory block 120-1 further includes a selector gate SG activated when memory block 120-1 is selected, to connect a main bit line MBLO with a sub bit line SBL.

Nonvolatile semiconductor memory device 100 is so-called NOR flash memory, the source of each memory transistor MT being connected to a common source line SL.

Nonvolatile semiconductor memory device 100 further includes a SL driver 12 for receiving a predetermined potential from high voltage generating circuit for programming/erasing 10 to set the potential of source line SL.

Sense amplifier circuit 18 includes sense amplifiers SA0 to SAn corresponding to respective bit lines, and a sense amplifier SAL for detecting current in main bit line MBLL to which lock bit memory transistor MTL is connected. Sense amplifier SAL outputs the result of the detected current to CPU 8, which determines, according to the output of sense amplifier SAL, whether the programming or erasing operation is performed for each of memory blocks 120-1 to 120-n.

Lock bit memory transistor MTL is a nonvolatile memory transistor with a floating gate, which is rewritable by an operation similar to that of normal data memory transistor MT. The state of lock bit memory transistor MTL defines whether a block may be subject to data rewriting, to provide a function of protecting the block from rewriting of data already programmed therein even when an instruction for data rewriting is executed.

Operations of a memory cell, i.e., the cell holding normal data, and a lock bit cell, i.e., the cell holding a lock bit, are described below by means of NOR memory for example.

FIG. 10 is a schematic illustrating a programming operation to a memory cell.

Referring to FIG. 10, a word line WL0 is set to 10V while word lines WL1–WL3 are set to 0V. A sub bit line SBL1 is set to 5V while a sub bit line SBL0 is set to 0V. A well in which a memory block to be programmed is formed is set to 0V and source line SL is also set to 0V.

Such settings allow a memory transistor connected to word line WL0 and sub bit line SBL1 to be selected. Electrons are injected into the floating gate of the selected memory transistor so that data "0" is held therein.

FIG. 11 is a schematic section view illustrating a programming operation to the selected cell in FIG. 10.

Referring to FIG. 11, a positive high voltage of approximately 10V is applied to word line WL and a positive voltage of approximately 5V is applied to sub bit line SBL, and the potentials of the P well and source line SL are set to 0V for electrons to be injected into the floating gate F from the P well and source S. The injection of electrons varies a threshold voltage Vth of the selected memory transistor to be approximately 6V or higher. This is called the programming operation.

For convenience of description, the impurity region connected to source line SL is referred to as source S and the impurity region opposite to source S with a channel region interposed therebetween is referred to as drain D.

FIG. 12 is a schematic circuit diagram illustrating a reading operation.

Referring to FIG. 12, word line WL0 is set to 3V, word lines WL1–WL3 are set to 0V and source line SL is set to 0V. The reading operation is performed by a sense amplifier connected to the sub bit line, determining whether current flows in the selected memory transistor to which word line WL0 is connected.

If the selected memory cell is in a programmed state, i.e., the state in which the threshold voltage Vth is higher than 6V, no current flows therein, which is recognized that data "0" is held in the selected cell. On the other hand, if the threshold voltage of the selected transistor is low, i.e., if the threshold voltage Vth is in a range of approximately 1–3V, current flows in the current path shown with a broken line in FIG. 12. In this case, it is recognized that data "1" is held in the memory transistor.

FIG. 13 is a schematic section view illustrating an operation of the selected memory transistor at the time of reading.

Referring to FIG. 13, gate G of the memory transistor is connected to word line WL and set to 3.0V. The drain D and source S of the memory transistor are respectively connected to sub bit line SBL and source line SL, the drain being set to 1.0V while the source being set to 0V. The potential of P well in which the memory transistor is formed is set to 0V. If electrons are injected into floating gate F and the threshold voltage Vth exceeds 6.0V, the memory transistor of the selected cell is not turned on even when the gate potential is 3.0V, avoiding current flowing from drain D to source S.

On the other hand, if only few electrons are injected into the floating gate F and the threshold voltage Vth is lower than 3.0V, current i flows from drain D to source S. The current i is detected by the sense amplifier connected to the sub bit line SBL, for reading the information in the selected cell.

FIG. 14 is a schematic circuit diagram illustrating an erasing operation of a memory cell.

Referring to FIG. 14, when the erasing operation is performed, word lines WL0–WL3 of the block to be subjected to the erasing operation are collectively set to −10V, while the potential of the well in which the memory block to be subjected to the erasing operation is formed is set to 10V, and source line SL is also set to 10V. Sub bit line SBL connected to the memory block subjected to the erasing operation is set open by setting the selector gate non-conductive.

In such settings, a high electric field is collectively applied to the memory transistors within the same well. Electrons are extracted from the floating gates of the memory transistors in a memory block subjected to the erasing operation, which is performed for collectively lowering the high threshold voltages Vth of the memory transistors to approximately 1–3V.

FIG. 15 is a schematic section view illustrating a potential to be set for each memory transistor in the erasing operation.

Referring to FIG. 15, gate G of the memory transistor is set to −10V via word line WL. Source S is set to 10V via source line SL. Drain D is set open by separating sub bit line SBL from main bit line MBL. P well is set to 10V.

Such setting of the potential allows electrons to be extracted from floating gate F into P well and source S. Thus, the threshold voltage Vth of the memory transistor is set in the erased state, i.e., in a range of 1–3V, lowered from the voltage of 6V or higher.

Conventionally, the memory transistor for lock bit is configured in a separate region from the memory array region for data storage or within the memory array region for data storage. However, in the case of providing the memory transistor for a lock bit in the region separated from the memory array region for data storage, there has been a problem that the area is increased since the well and so forth must also be separated. In spite of the same data rewriting operation of the lock bit cell and that of the memory cell, the separated regions may change the cell properties, varying, for example, the threshold voltages Vth of the memory cells after the data rewriting operation. This may result in possible reading error of either the lock bit cell or the memory cell at the time of reading.

Therefore, a number of methods have been employed to provide the lock bit cell within the memory array region, which would be advantageous in terms of the area and reliable in reading operation.

FIG. 16 is a section view illustrating a structure in which the memory cell for data storage and the lock bit memory cell are provided in the same well.

Though the section shown in FIG. 16 is a section of a column in which the lock bit memory cell is provided, the column of the memory cell for holding normal data provided adjacent thereto also has a similar sectional structure.

Referring to FIG. 16, an N well 132 is provided on a P substrate 130, and P wells 134, 136 and 138 are provided in N well 132. P well 134 is a P well in which a memory cell of a block 1 is formed. P well 138 is a P well in which a memory cell of a block 2 is formed. P well 136 is a P well in which selector gates SG-L1 and SG-L2 are formed for selectively connecting main bit line MBL with the sub bit line.

Provided on the main surface of P well 134 are a memory transistor for a lock bit MTL1 and a dummy memory transistor MD arranged in the same column as memory transistor MTL1. Memory transistor MTL1 shares an N type impurity region forming source S, with dummy memory transistor MD, the N type impurity region being connected to source line SL.

Drain D1 of memory transistor MTL1 and drain D2 of dummy memory transistor MD are connected to a common sub bit line SBLL1, the sub bit line SBLL1 being coupled to main bit line MBL when the selector gate SG-L1 becomes conductive.

Thus, when an erase command or a data programming command for memory block 1 is input, selector gate SG-L1 and the gate potential of memory transistor MTL are first activated. The lock-bit state is then detected by the sense amplifier connected to main bit line MBL, for transmission to the CPU, which in turn determines whether or not the memory block corresponding to the lock bit is actually erased/programmed.

In the configuration as shown in FIG. 16, the dummy cell is connected to the same bit line as that of the lock bit cell.

It is advantageous in terms of the area that the lock bit cell is formed to have a size equal to that of the memory cell for normal data. This is because the memory cell for normal data is designed to have a size as small as permissible in order to maintain the area of the memory array to be small.

Thus, an extra column is provided in the memory block to provide the lock bit cell. A number of dummy memory cells are also provided in addition to the cell used for the lock bit. Though the dummy memory cells may be used to store information, those cells are left as unusable dummy cells since the storage of normal data therein would complicate address control or the like.

It is possible to form only the lock bit cell and no other memory cells, which would, however, cause the loss of pattern uniformity in the column having the lock bit cell. As previously described, the memory cell portion uses a transistor having a size as small as permissible, so that the breakage of the pattern uniformity may cause undesirable inconsistency in etching in the manufacturing process. Thus, the dummy cells not particularly used for storing data are provided in the column where the lock bit is provided.

However, when the dummy cells are in an over-erased state, a problem of reading error arises at the time of reading information in the lock bit cell.

FIG. 17 is a graph illustrating the over-erased state.

Referring to FIG. 17, in the memory block, the memory transistors inside thereof are collectively erased, so that the application of voltage is repeated until the threshold voltages of all the memory transistors are reduced to 3.0V or lower. However, the memory transistors have different threshold values respectively, because of respective data programmed previously. In addition, some memory transistors are more susceptible than others, in shifting of the threshold voltages.

For the reasons described above, the distribution of the threshold voltages after the erasing operation has a more or less variation even within one block. In the case where such variation is caused, the cell of which the threshold voltage Vth is 0V or lower is referred to as an over-erased cell.

In FIG. 17, the voltage distribution of the memory transistors in the over-erased state is shown in the shaded portion. The memory transistor in the over-erased state may result in a depletion mode transistor in which drain current flows even when the gate voltage is 0V.

FIG. 18 is a graph showing characteristics of the gate voltage and the drain current of the memory transistor having different threshold voltages in the erased state.

Referring to FIG. 18, if the threshold voltage is 1V or 3V, the drain current is smaller than a predetermined value when the gate voltage Vg is 0V. If the threshold voltage is 0V, however, the current equal to the predetermined value flows in the memory transistor even when the gate voltage Vg is 0V. Moreover, the memory transistor having the threshold voltage of −1.0V causes the drain current to flow therein unless the gate voltage is set to have a potential of considerably large value in the negative side.

FIG. 19 is a circuit diagram illustrating the reading error of the lock bit.

Referring to FIG. 19, the over-erased state of the dummy cell MD-1 is discussed. When the memory transistor MTL holding lock-bit information is to be read, word line WL0 is activated while word lines WL1–WL3 are inactivated, providing a potential difference between the source line and the main bit line.

Then, current i flowing from main bit line MBLL to source line SL via sub bit line SBLL is detected. However, if the memory transistor in the over-erased state as described exists, current flows even when the gate potential is 0V in the dummy cell MD-1 which is supposed to be inactivated, so that the current i will be detected even when no current is actually flowing in memory transistor MTL.

Memory transistor MTL is recognized to be always in the erased state, i.e., the state holding data "1," which wrongly permits the erasing or programming of memory block 120 according to this information.

To avoid such malfunction, when the over-erased state of the dummy cell is detected for threshold voltage Vth to be in a normal range, the operation such as reprogramming of each bit must be performed, resulting in a problem leading to increased operation time.

SUMMARY OF THE INVENTION

An object of the invention is to provide a nonvolatile semiconductor memory device with improved reliability and shortened operation time, preventing a lock bit memory cell from malfunctioning due to a dummy cell.

According to one aspect of the invention, the present invention relates to a nonvolatile semiconductor memory device including memory blocks each as a unit for collectively performing an erasing operation. Each of the memory blocks includes a plurality of normal memory cells, arranged in matrix of normal rows and normal columns, holding normal data provided from an external source, and a lock bit cell column (a column including a lock bit) arranged adjacent to at least any one of the plurality of normal columns, holding the lock bit forming permission information on programming and erasing for a memory block. The lock bit cell column includes a first field effect transistor with a floating gate, connected between a first internal node and a second internal node, holding the lock bit depending on a threshold voltage, and a second field effect transistor connected between the second internal node and a third internal node electrically isolated form the first internal node.

According to another aspect of the invention, a nonvolatile semiconductor memory device includes memory blocks each as a unit for collectively performing the erasing operation. Each of the memory blocks includes a plurality of normal memory cells, arranged in matrix of normal rows and normal columns, holding normal data provided from an external source, a plurality of word lines respectively provided corresponding to the normal rows, and a lock-bit cell column arranged adjacent to at least any one of the normal columns, holding a lock bit forming permission information on programming and erasing for the memory block. The lock-bit cell column includes first and second field effect transistors each having a control gate and a floating gate. The first field effect transistor is connected between first and second internal nodes, holding a lock bit depending on the threshold voltages, the control gate thereof being connected to any one of the plurality of word lines. The second field effect transistor is connected in parallel with the first field effect transistor, the control gate thereof being connected to a third internal node having a potential where no extraction of electrons from the floating gate occurs at the time of collective erasing of the memory block.

According to a further aspect of the invention, a nonvolatile semiconductor memory device includes memory blocks each as a unit for collectively performing the erasing operation. Each of the memory blocks includes a plurality of normal memory cells, arranged in matrix of normal rows and normal columns, holding normal data provided from an external source, and a lock-bit cell column arranged adjacent to at least any one of the plurality of the normal columns, holding a lock bit forming permission information on programming and erasing for the memory block. The lock-bit cell column includes a first field effect transistor with the floating gate, connected between a first internal node and a second internal node, holding a lock bit depending on a threshold voltage, and a second field effect transistor without a floating gate, connected in parallel with the first field effect transistor.

Thus, it is a main advantage of the present invention that the reading of the lock bit is not influenced even when the dummy cells are in the over-erased state, resulting in improved reliability of lock-bit reading and shortened operation speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
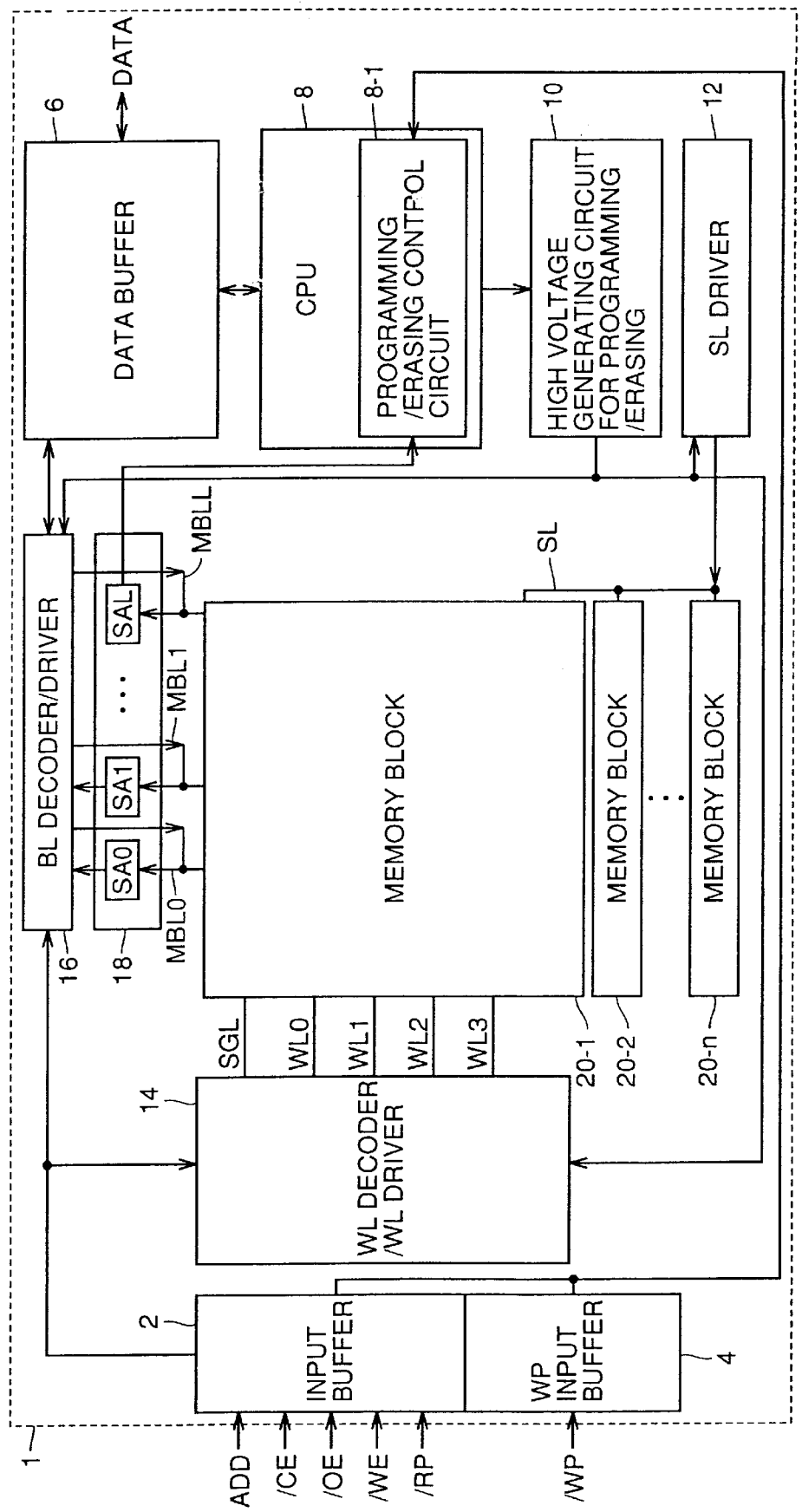
FIG. 1 is a schematic block diagram illustrating a configuration of a nonvolatile semiconductor memory device 1 of the first embodiment of the present invention.

Embodiments of the present invention are described below in detail with reference to the drawings. In the drawings, it is noted that the same reference characters denote the same or corresponding portions.

First Embodiment

FIG. 1 is a schematic block diagram illustrating a configuration of a nonvolatile semiconductor memory device 1 of the first embodiment of the present invention.

Referring to FIG. 1, nonvolatile semiconductor memory device 1 with a ROM (Read Only Memory) provided therein includes a CPU 8 for controlling programming and erasing operations in response to a program code held in the ROM and a command signal applied from an external source, a high voltage generating circuit 10 for programming/erasing controlled by CPU 8 for generating a high voltage for programming and erasing from an external power potential (not shown), and memory blocks 20-1 to 20-n formed within P wells electrically separated from one another. Memory blocks 20-1 to 20-n are generally arranged within one or two memory arrays. The erasing operation of nonvolatile semiconductor memory device 1 is performed for each of memory blocks 20-1 to 20-n.

Nonvolatile semiconductor memory device 1 further includes an input buffer 2 for receiving an address signal ADD, a chip enable signal/CE, an output enable signal/OE, a write enable signal/WE and a reset signal/RP from an external source, a WP input buffer 4 for receiving a write protect signal/WP from an external source, a WL decoder/WLdriver 14 for selecting a memory block and a word line in response to a row address signal applied from input buffer 2, a data buffer 6 for transmitting/receiving a data signal DATA to/from an external source, a BL decoder/driver 16 for selecting a bit line in response to a column address applied from input buffer 2 to transmit/receive data between the selected bit line and data buffer 6, and a sense amplifier circuit 18 for detecting current flowing in the bit line at the time of reading to perform the reading operation.

The nonvolatile semiconductor memory device 1 is so-called NOR flash memory, the sources of memory transistors included in each memory block being connected to a common source line SL. Nonvolatile semiconductor memory device 1 further includes an SL driver 12 for receiving a predetermined potential from high voltage generating circuit for programming/erasing 10 to set the potential of source line SL.

Sense amplifier circuit 18 includes sense amplifiers SA0–SAn corresponding to respective bit lines and a sense amplifier SAL for detecting current of main bit line MBLL to which a memory transistor MTL for a lock bit is connected. Sense amplifier SAL outputs the detected result of current to CPU 8, which in turn determines, in response to the output of sense amplifier SAL, whether or not programming/erasing operations should be performed for each of memory blocks 20-1 to 20-n.

A typical operation of nonvolatile semiconductor memory device 1 is now described. An address designating a memory cell to be operated is input in response to address signal ADD. A signal representing a command is first input from the terminal to which data signal DATA is input. The nonvolatile semiconductor memory device initiates the programming or erasing operation, for example, by inputting 8-bit signal such as 20H or D0H. The command may be designated by a combination of signals which are input several times.

CPU 8 determines which input data corresponds to the command to control execution of an operation associated with the command.

When a programming or erasing command is input, CPU 8 confirms the state of the write protect signal/WP and the state of a lock bit of a memory block designated by the address signal. The lock bit is held in a lock bit memory cell prepared, in each memory block, separately from a memory cell for holding normal data. Lock bit "0" represents prohibition of programming/erasing, and lock bit "1" represents permission of programming/erasing.

When CPU 8 receives the address signal, it determines which memory block is designated, to first activate a corresponding word line, sense amplifier or the like for reading of a memory cell holding a lock bit. As a result, in the case that the write protect signal/WP is activated and the lock bit represents prohibition of programming/erasing, CPU8 determines that the input programming or erasing command is invalid, allowing no programming or erasing operation.

If, on the other hand, the write protect signal/WP is inactivated or the lock bit is in the state of permitting programming/erasing, CPU 8 controls for execution of programming or erasing for the address designated by the address signal.

Programming of the lock bit, for example, includes operations of selecting a memory block to be programmed by the address signal, inactivating the write protect signal/WP, inputting "a lock-bit selecting command" as a data signal designating the command, and thereafter inputting the "programming command." CPU 8 then initiates the programming operation for the memory cell holding the lock bit.

The lock bit is erased, i.e., the designated memory block is made programmable, by collectively erasing the data of memory cells included in the designated memory block. Thus, it is impossible to rewrite the data from "0" to "1," i.e., to erase data, in only the memory cell holding the lock bit. The memory cell for holding the lock bit is provided in a column adjacent to a column of other memory cells in the memory block and within the same well as that of other memory cells. Memory cell holding the lock bit is collectively erased along with other memory cells in the same block in a manner similar to the other memory cells.

Thus, erasing of the lock bit includes, more specifically, the operations of selecting a memory block to be erased by the address signal, inactivating the write protect signal/WP, and inputting "erasing command." CPU 8 then performs the erasing operation for the memory cells of the entire memory block including the lock bit cell. It is noted that no erasing operation is performed when the write protect signal/WP is activated.

Figure 2:
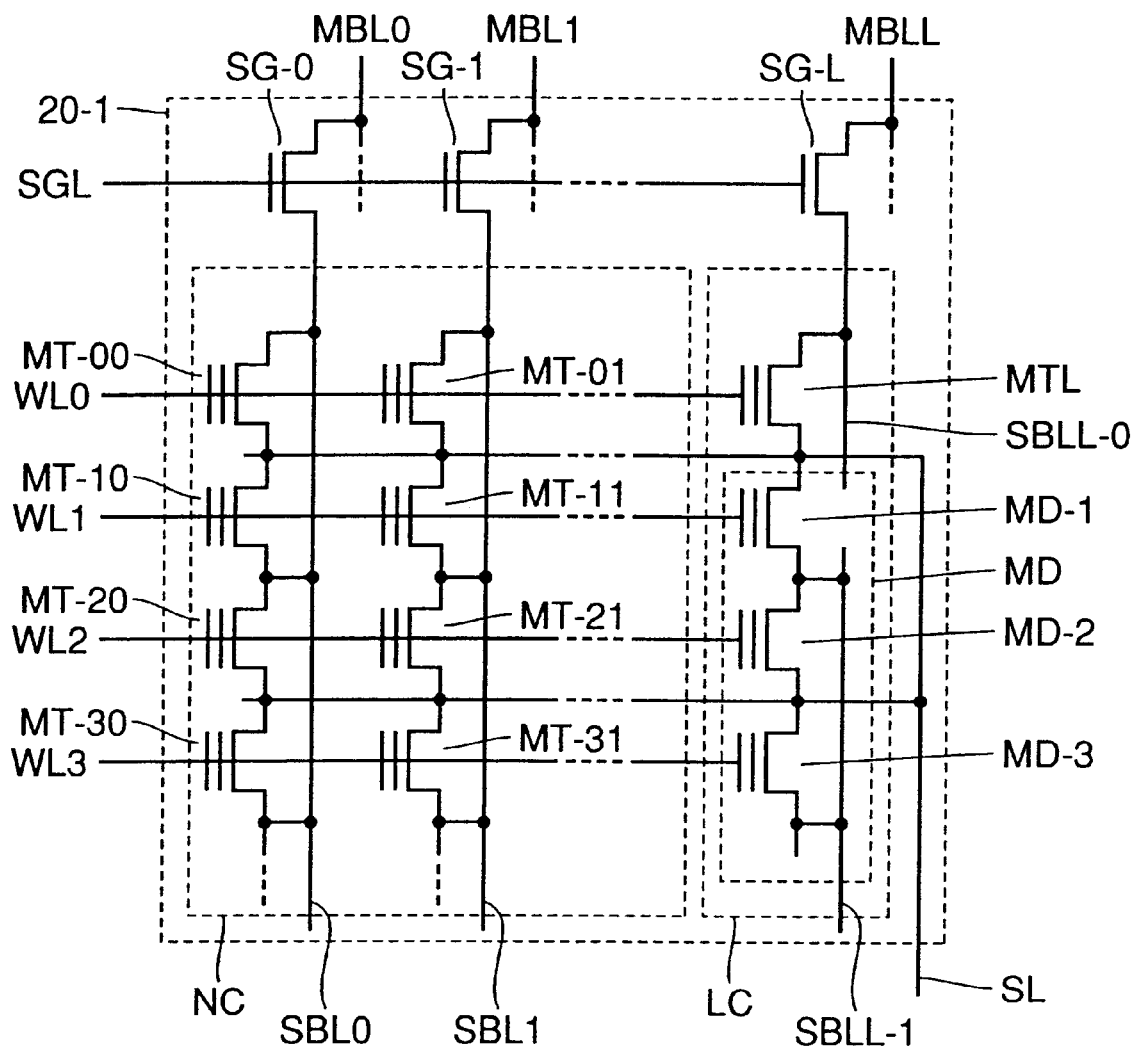
FIG. 2 is a circuit diagram illustrating a configuration of a memory block 20-1 shown in FIG. 1.

FIG. 2 is a circuit diagram illustrating a configuration of memory block 20-1 shown in FIG. 1.

Referring to FIG. 2, memory block 20-1 includes a normal memory cell group NC for holding data according to an address provided from an external source, a lock bit column LC for holding lock bit information, and selector gates SG-0 to SG-L for connecting the memory columns to respective main bit lines MB0 to MBLL.

Normal memory cell group NC includes memory transistors MT-00 to MT-mn (m and n are natural numbers) arranged in matrix of m'rows and n'columns. A part of these memory transistors is shown in FIG. 2. Sub bit line SBL0 is provided corresponding to memory transistors MT-00 to MT-30, sub bit line SBL0 being connected to main bit line MBL0 via selector gate SG-0.

Sub bit line SBL1 is provided corresponding to memory transistors MT-01 to MT-31, sub bit line SBL1 being connected to main bit line MBL1 via selector gate SG-1.

Lock bit column LC includes a memory transistor MTL for holding a lock bit and a dummy cell group MD formed in the same row as that of memory transistor MTL. Dummy cell group MD includes dummy cells MD-1 to MD-3.

Word line WL0 is commonly connected to control gates of memory transistors MT-00, MT-01 and memory transistor MTL for lock bit. Word line WL1 is commonly connected to control gates of memory transistors MT-10, MT-11 and dummy cell MD-1. Word line WL2 is commonly connected to control gates of memory transistors MT-20, MT-21 and dummy cell MD-2. Word line WL3 is commonly connected to control gates of memory transistors MT-30, MT-31 and dummy cell MD-3.

The sources of memory transistors within the block are commonly connected to source line SL. The drain of memory transistor MTL for lock bit is connected to sub bit line SBLL-0, which in turn is connected to main bit line MBLL via selector gate SG-L.

The drains of dummy cells MD-1 to MD-3 are connected to sub bit line SBLL-1 electrically isolated from sub bit line SBLL-0.

Such configuration eliminates the possibility of malfunction even when dummy cells MD-1 to MD-3 are in the over-erased state, since these dummy cells are not connected in parallel with the path in which current flows when memory transistor MTL is turned on.

Figure 3:
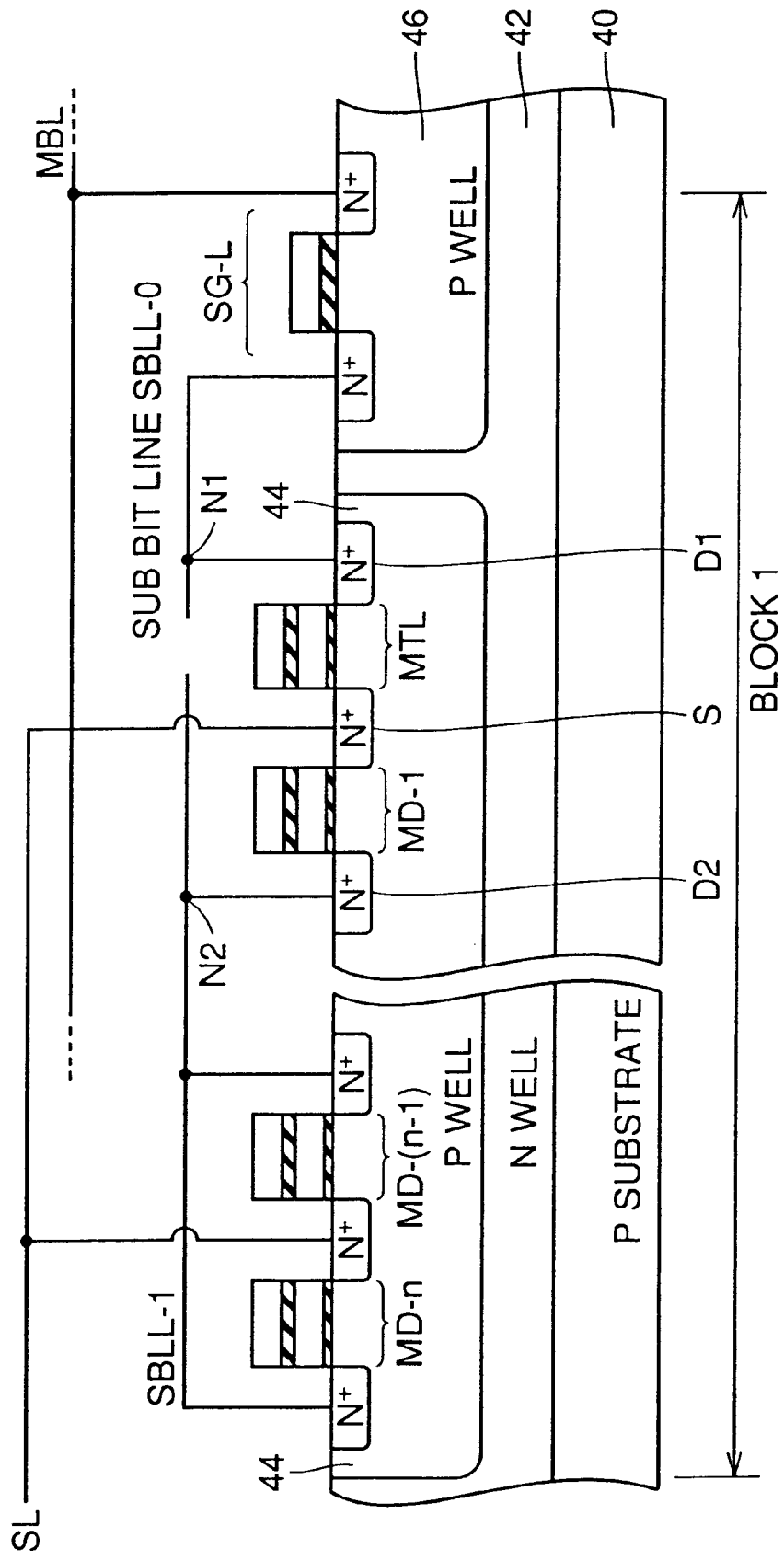
FIG. 3 is a section view of a column in which a memory transistor MTL holding a lock bit in the first embodiment is provided.

FIG. 3 is a section view illustrating the column where lock bit memory transistor MTL is provided in the first embodiment.

Referring to FIG. 3, an N well 42 is provided on a P substrate 40 and P wells 44 and 46 are provided within the N well. Transistor SG-L for selector gate is provided in P well 46 and lock bit memory transistor MTL and dummy cells MD-1 to MD-n are provided on the main surface of P well 44.

The impurity region connected to source line SL is referred to as source of a memory transistor for convenience of description, while the impurity region opposite to the source with a channel region interposed therebetween is referred to as drain. Source S of memory transistor MTL is an N type impurity region, the source being shared with dummy cell MD-1. Drain D1 of memory transistor MTL is an N type impurity region connected to sub bit line SBLL-0 at a node N1. Drain D2 of dummy cell MD-1 is an N type impurity region connected to sub bit line SBLL-1 in the same manner as the drains of other dummy cells.

Since sub bit line SBLL-0 and sub bit line SBLL-1 are electrically isolated nodes N1 and N2 respectively, the reading of memory transistor MTL will not be influenced even if the dummy cells are constantly in the conductive state due to the over-erasing. Thus, compared with conventional example, the present invention is advantageous in increased reliability of the lock-bit reading and in shortened operation time.

Modification of First Embodiment

Figure 4:
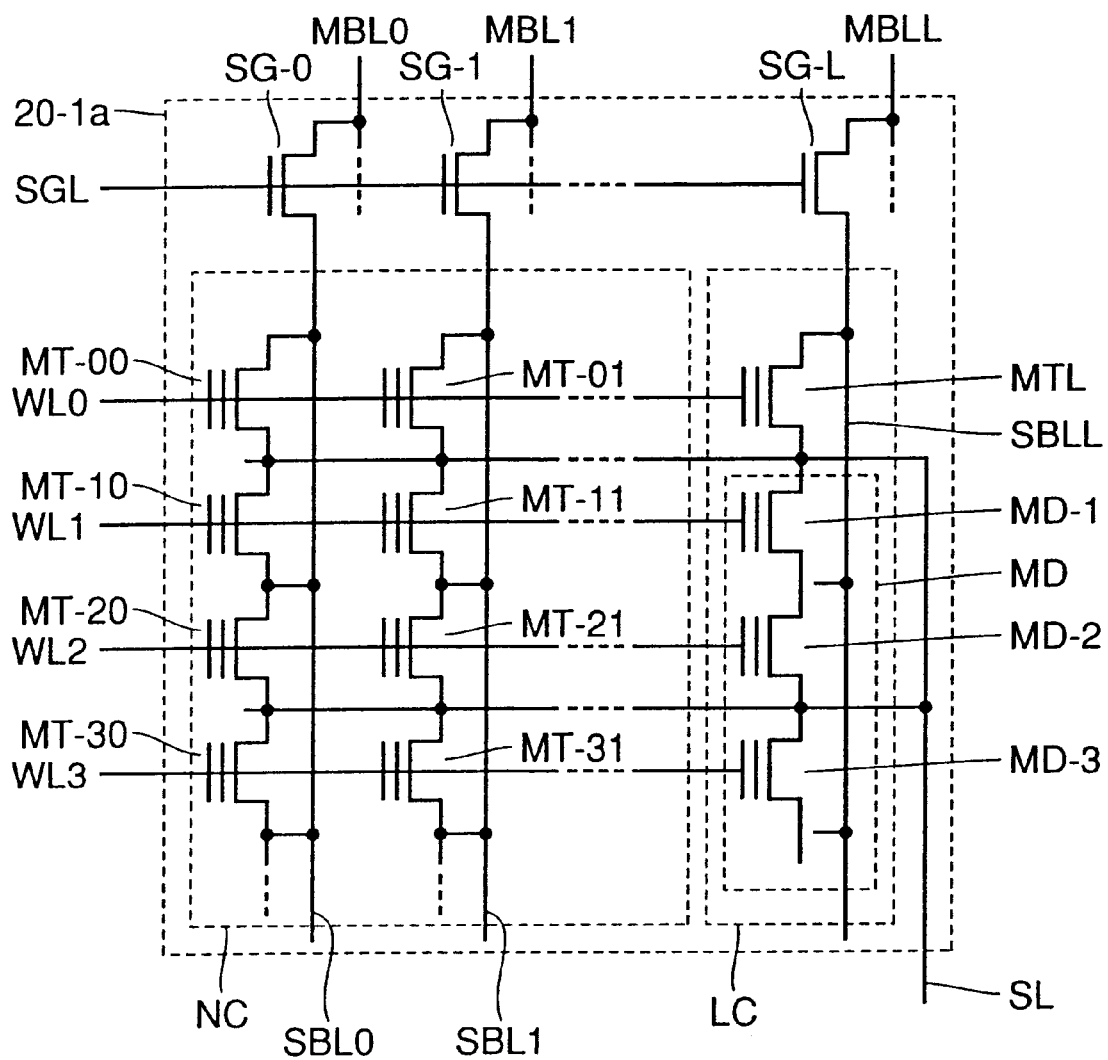
FIG. 4 shows a modification of the first embodiment.

FIG. 4 shows a modification of the first embodiment.

Referring to FIG. 4, in a memory block 20-1a used in modification 1 of the first embodiment, instead of cutting off sub bit line SBLL, the contact hole in the drain region shared by dummy cells MD-1 and MD-2 is removed for the drain to be separated from sub bit line SBLL. The drain of dummy cell MD-3 is also separated from sub bit line SBLL by removing its contact hole. These are aspects different from those of memory block 20-1 shown in FIG. 2. Other structures are similar to those of memory block 20-1 and description thereof will not be repeated.

Such configuration allows reading of memory transistor MTL holding a lock bit not to be influenced even if dummy cells MD-1 to MD-3 are over erased as in the case of the first embodiment.

Second Embodiment

Figure 5:
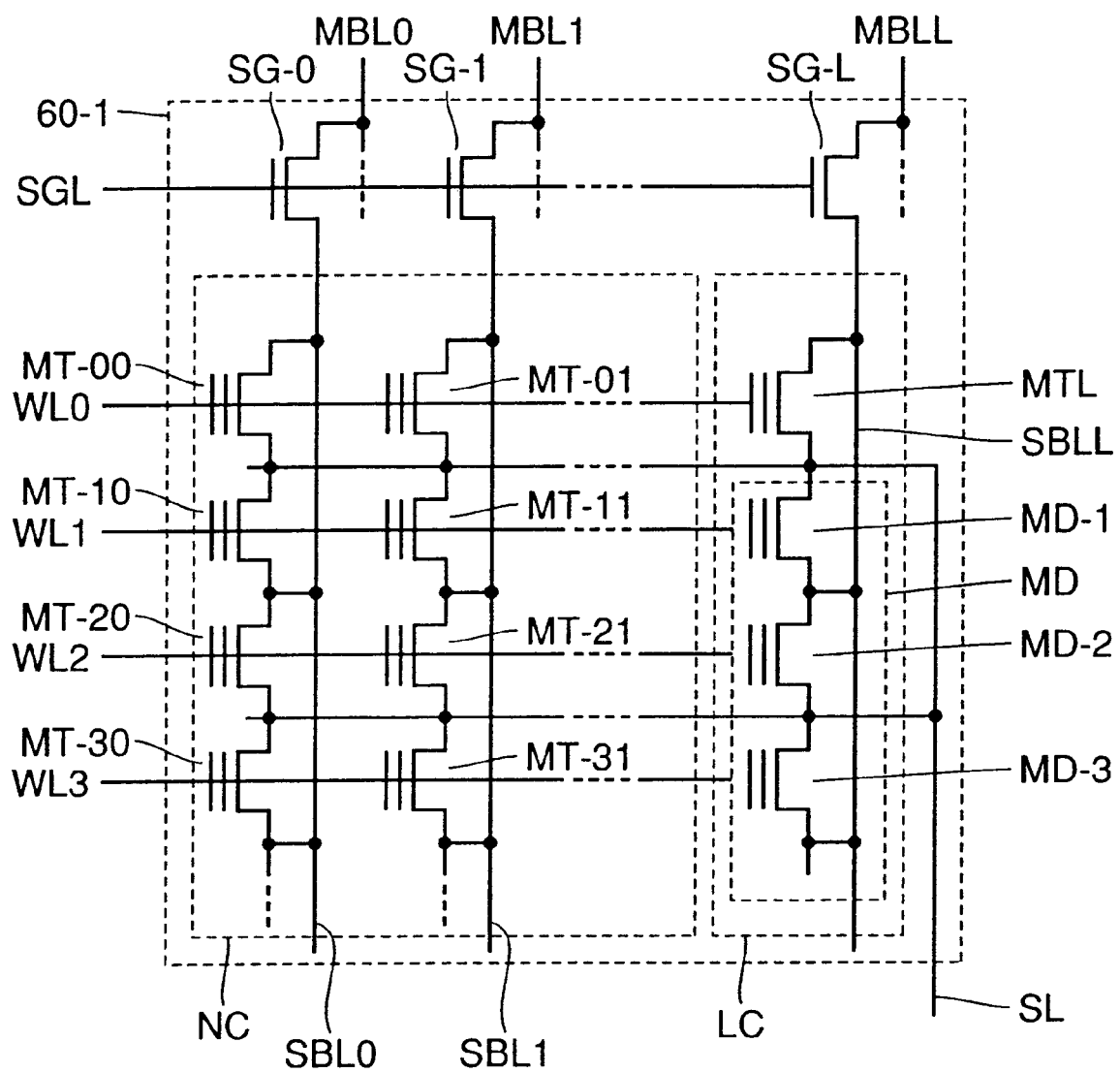
FIG. 5 is a circuit diagram illustrating a configuration of a memory block 60-1 used in the second embodiment.

FIG. 5 is a circuit diagram showing a configuration of a memory block 60-1 used in the second embodiment.

Referring to FIG. 5, in the configuration of memory block 60-1, the drains of memory transistor MTL and dummy cells MD-1 to MD-3 are connected to the commonly provided sub bit line SBLL. This configuration is different from that of memory block 20-1 shown in FIG. 2 in that the control gates of dummy cells MD-1 to MD-3 are electrically isolated from word lines WL1 to WL3 respectively. Other structures are similar to those of memory block 20-1, and description thereof will not be repeated.

Figure 6:
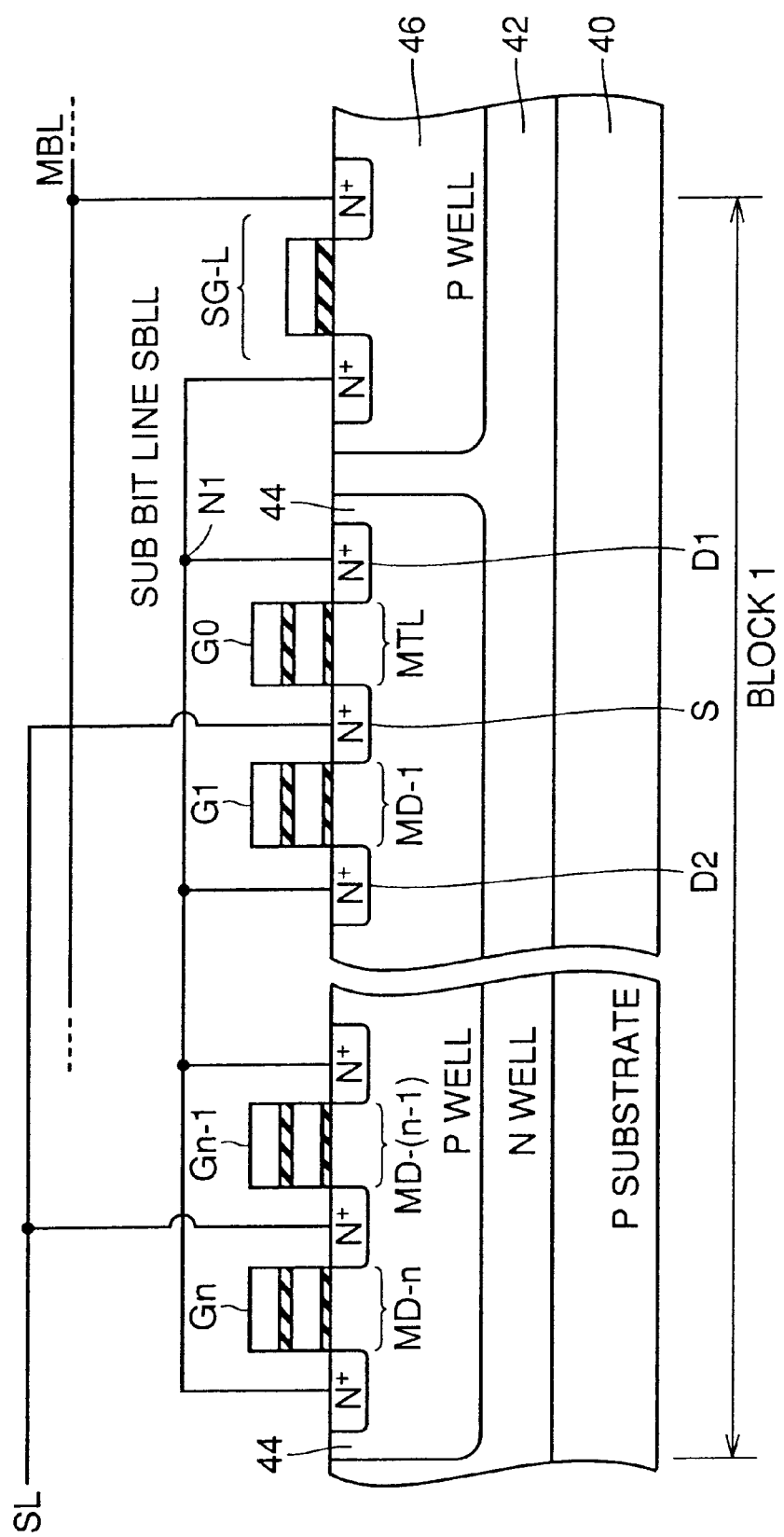
FIG. 6 is a section view of a column in which a lock bit memory transistor MTL of memory block 60-1 shown in FIG. 5 is included.

FIG. 6 is a section view illustrating a column in which lock bit memory transistor MTL of memory block 60-1 shown in FIG. 5 is included.

Referring to FIG. 6, the section view of the second embodiment is different from the one shown in FIG. 3, in that drain D2 of dummy cell MD-1 and the drain of memory transistor MTL are connected to the common sub bit line SBLL. Further, gate G1 of dummy cell MD-1, gate Gn-1 of a dummy cell MD-(n-1) and gate Gn of dummy cell MD-n are separated from the adjacently-provided gate of the memory cell for storing normal data. Thus, the variation in the potential of the word line causes no variation in the potential of gates G1 to Gn, whereby avoiding application of high voltage between the gates and the wells of dummy cells MD-1 to MD-n when collective erasing of block 1 is performed. Therefore, the threshold voltage of dummy cell MD-1 would not be subjected to a variation equivalent to the over-erased state, so that malfunction at the time of lock-bit reading can be prevented.

Preferably, gates G1 to Gn have the same potential as that of source line SL.

As described above, the configuration in the second embodiment prevents the dummy cells from being over erased. This is because the potential is set to cause no extraction of electrons from the floating gate into the transistor gate for the dummy cell, at the time of collectively erasing the data in the memory block. Thus, an advantageous nonvolatile semiconductor memory device with improved reliability of lock-bit reading and shortened operation time can be provided.

Third Embodiment

Figure 7:
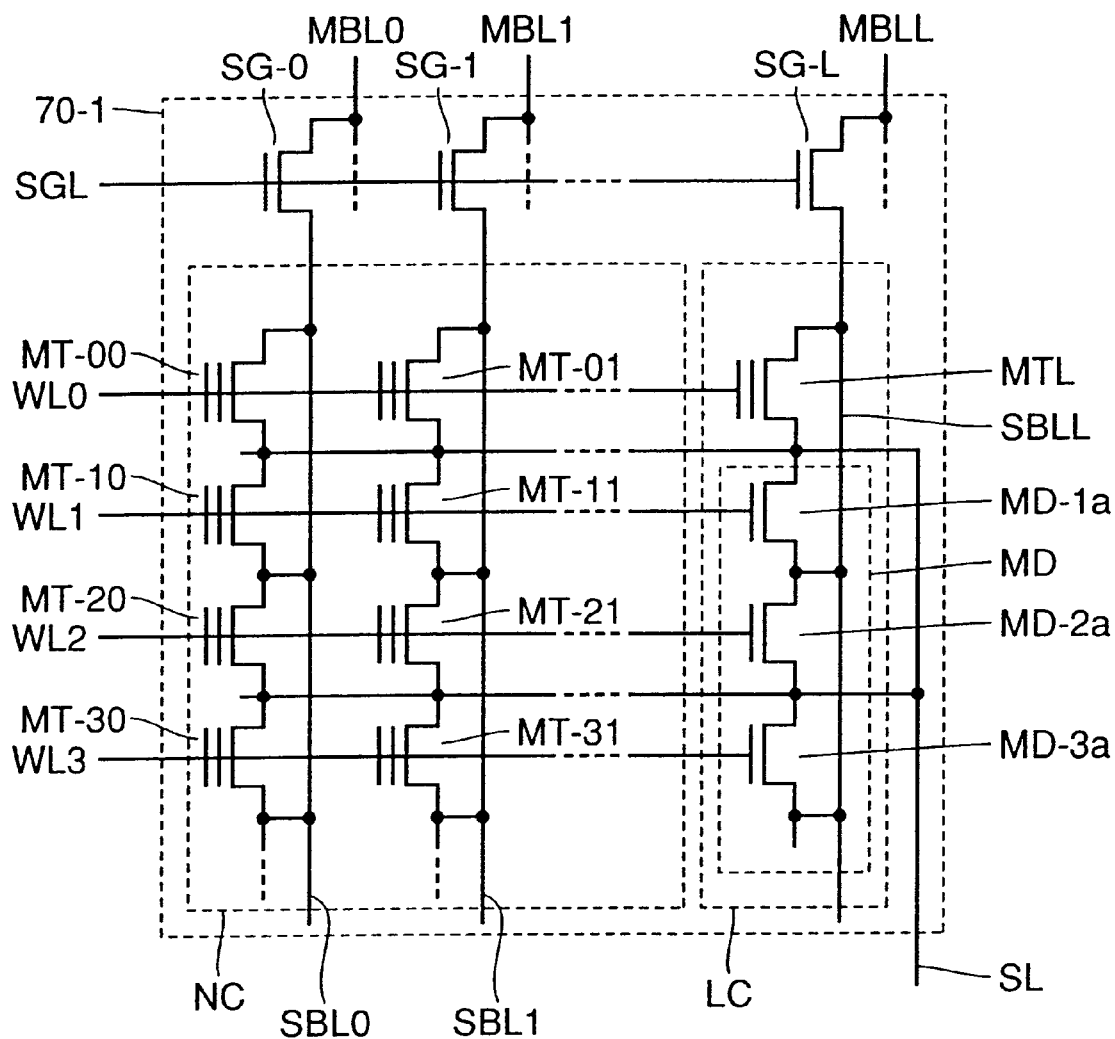
FIG. 7 is a circuit diagram illustrating a configuration of a memory block 70-1 used in the third embodiment.

FIG. 7 is a circuit diagram illustrating a configuration of a memory block 70-1 used in the third embodiment of the present invention.

Referring to FIG. 7, memory block 70-1 is different from memory block 20-1 in that dummy cells MD-1a to MD-3a are provided in place of dummy cells MD-1 to MD-3. Sub bit lines SBLL-0 and SBLL-1 are connected to form a common sub bit line SBLL to which the drain of memory transistor MTL and the drains of dummy cells MD-1a to MD-3a are connected.

Other structures are similar to those of memory block 20-1 shown in FIG. 2, and description thereof will not be repeated.

Dummy cells MD-1a to MD-3a are MOS transistors having no floating gate rather than memory transistors with floating gates.

Figure 8:
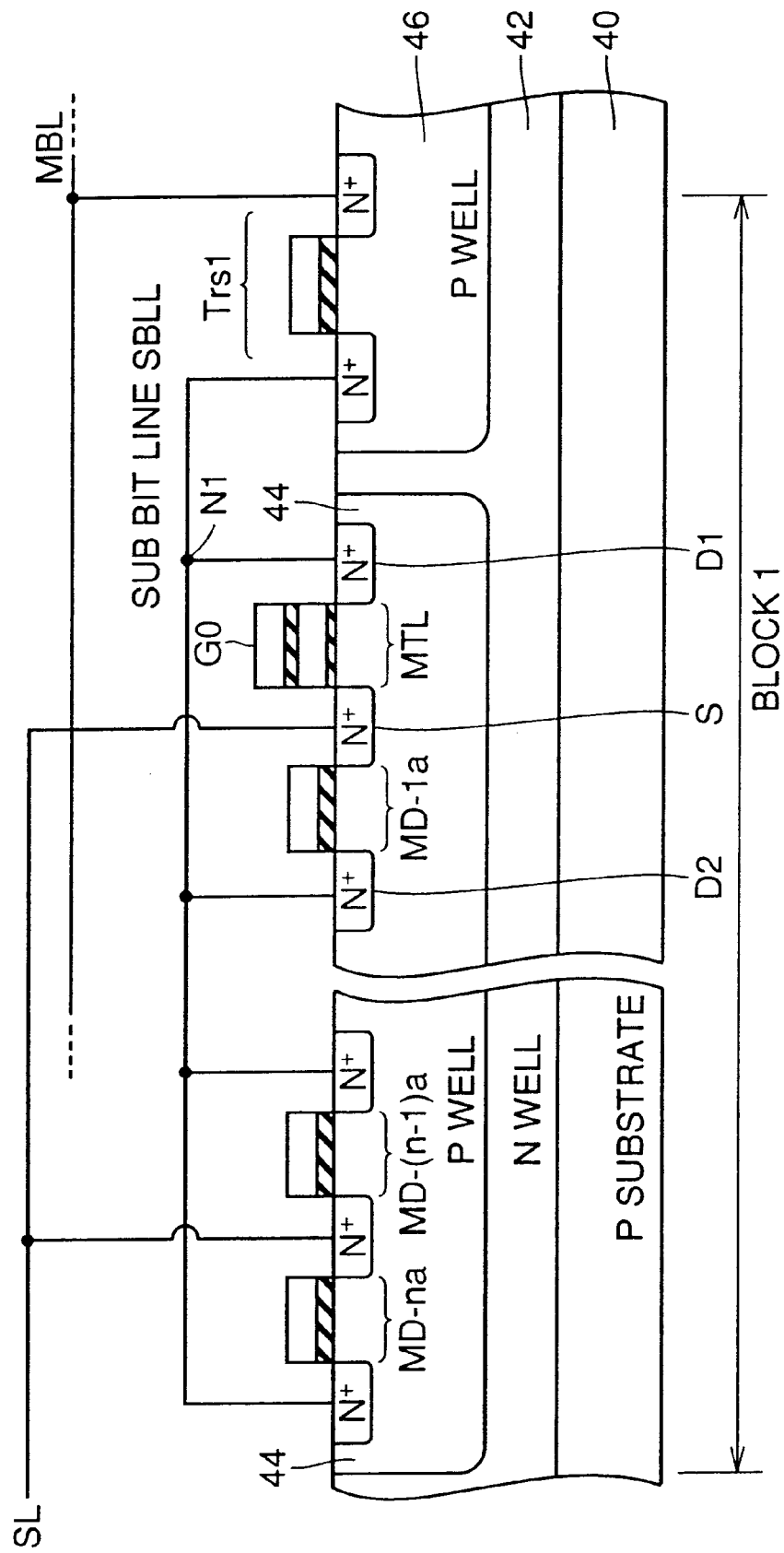
FIG. 8 is a section view of a column in which memory transistor MTL of memory block 70-1 shown in FIG. 7 is included.
Figure 9:
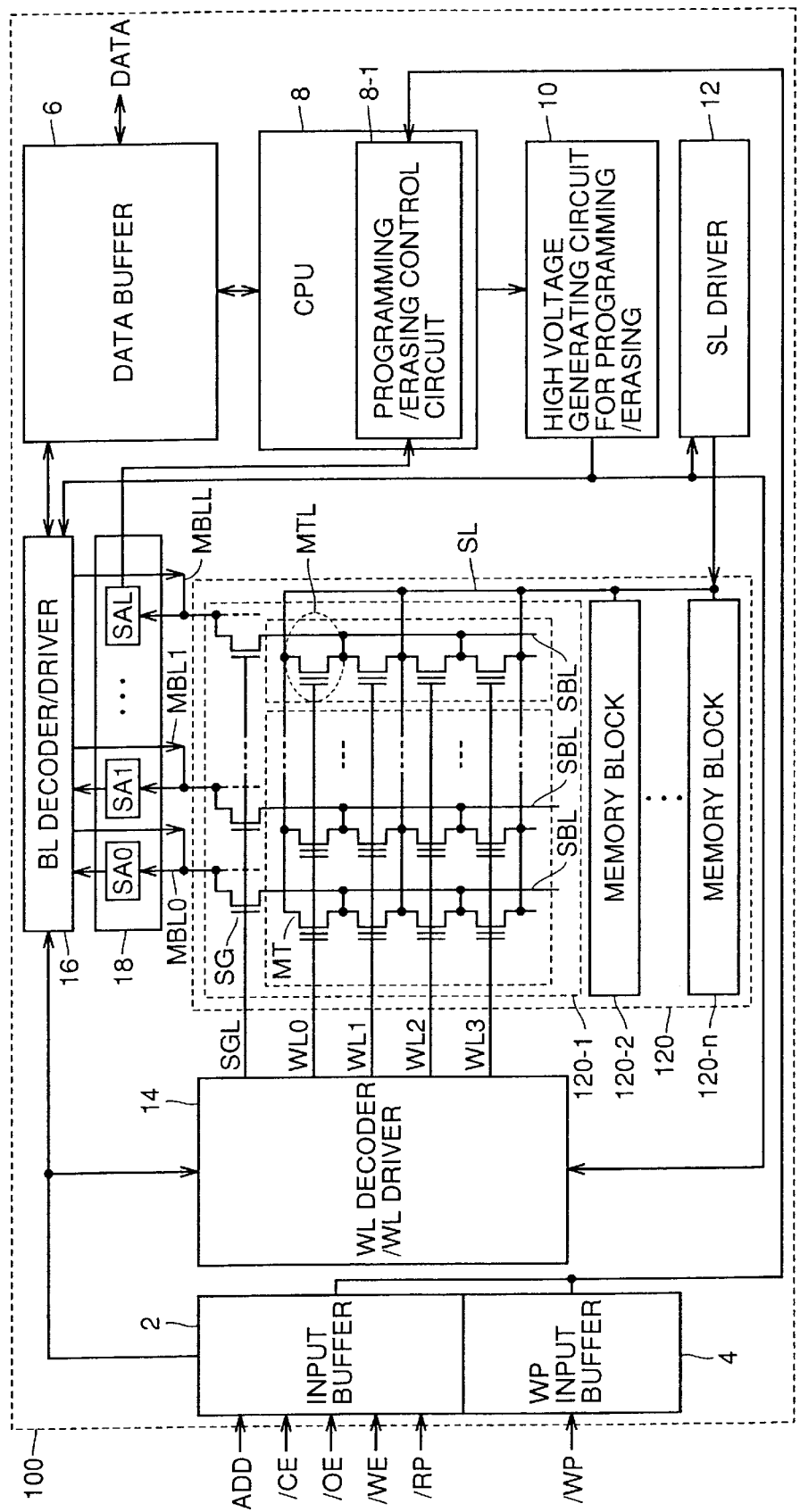
FIG. 9 is a schematic block diagram illustrating a configuration of a conventional nonvolatile semiconductor memory device 100.
Figure 10:
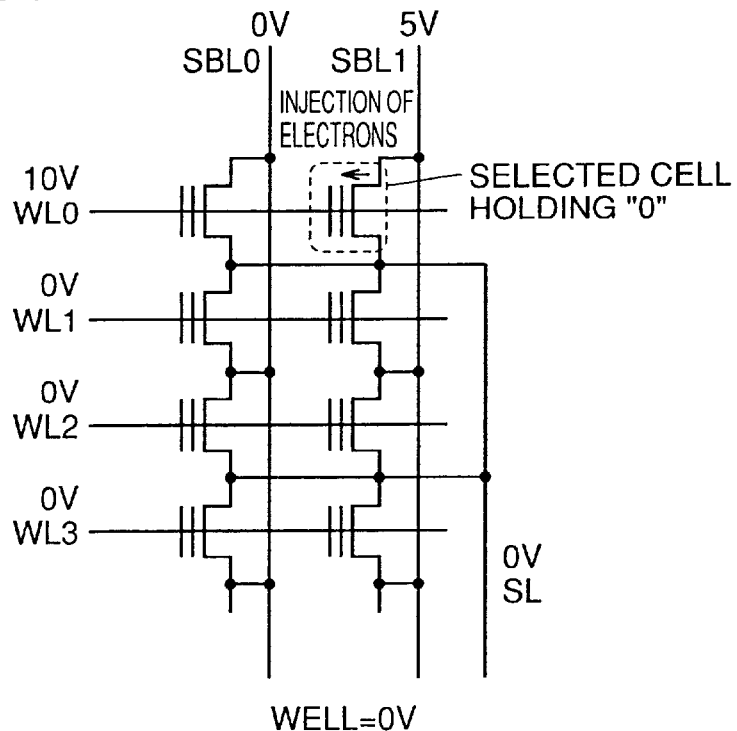
FIG. 10 is a schematic illustrating a programming operation for the memory cell.
Figure 11:
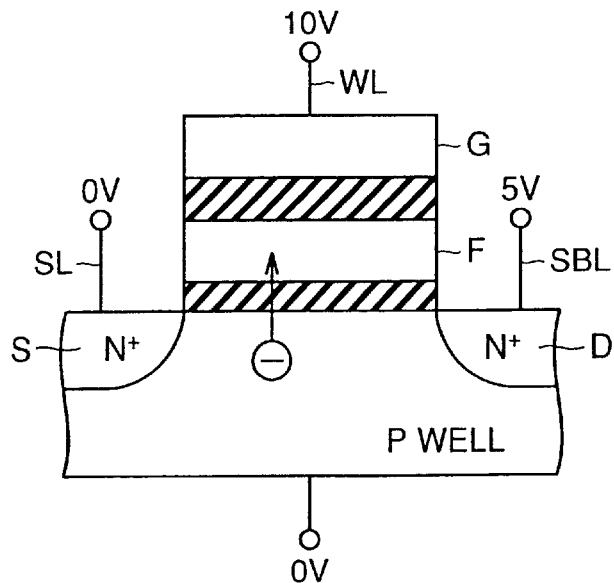
FIG. 11 is a schematic section view illustrating a programming operation for the selected cell of FIG. 10.
Figure 12:
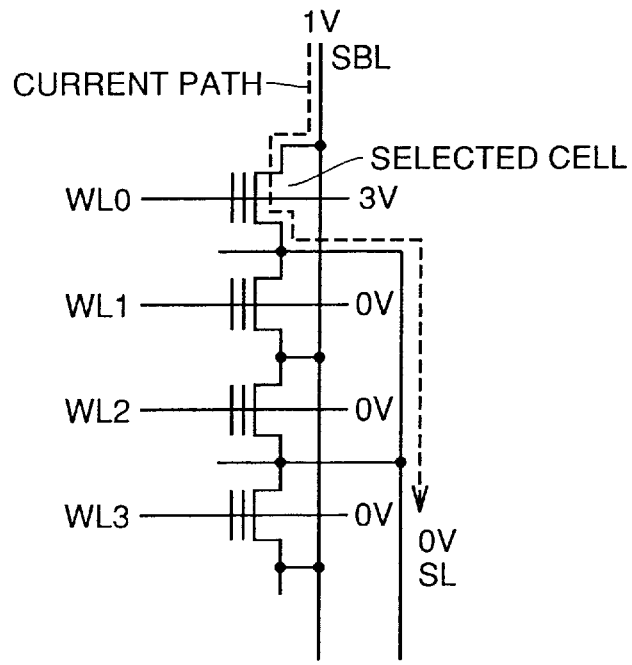
FIG. 12 is a schematic circuit diagram illustrating a reading operation.
Figure 13:
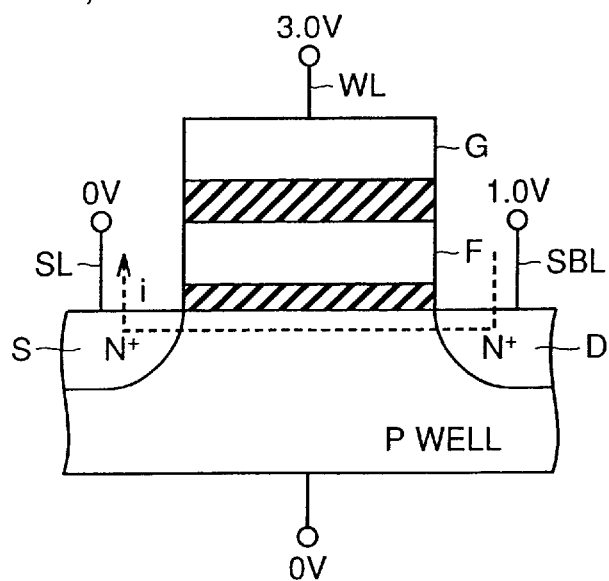
FIG. 13 is a schematic section view illustrating the operation at the time of reading the selected memory transistor.
Figure 14:
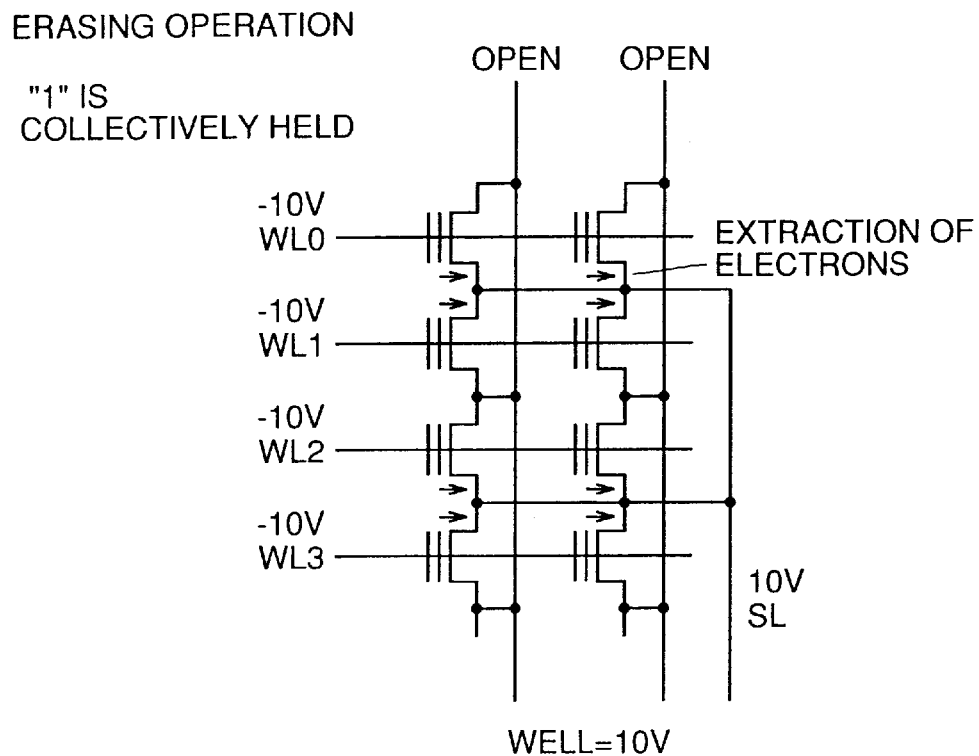
FIG. 14 is a schematic circuit diagram illustrating an erasing operation of a memory cell.
Figure 15:
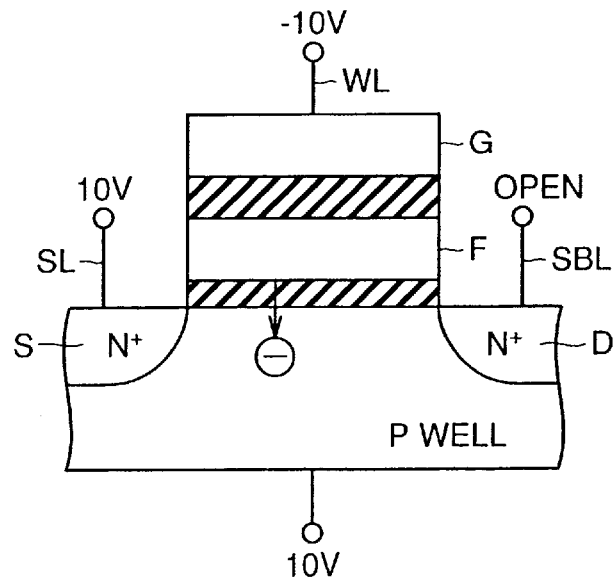
FIG. 15 is a schematic section view illustrating the potential set for each memory transistor in the erasing operation.
Figure 16:
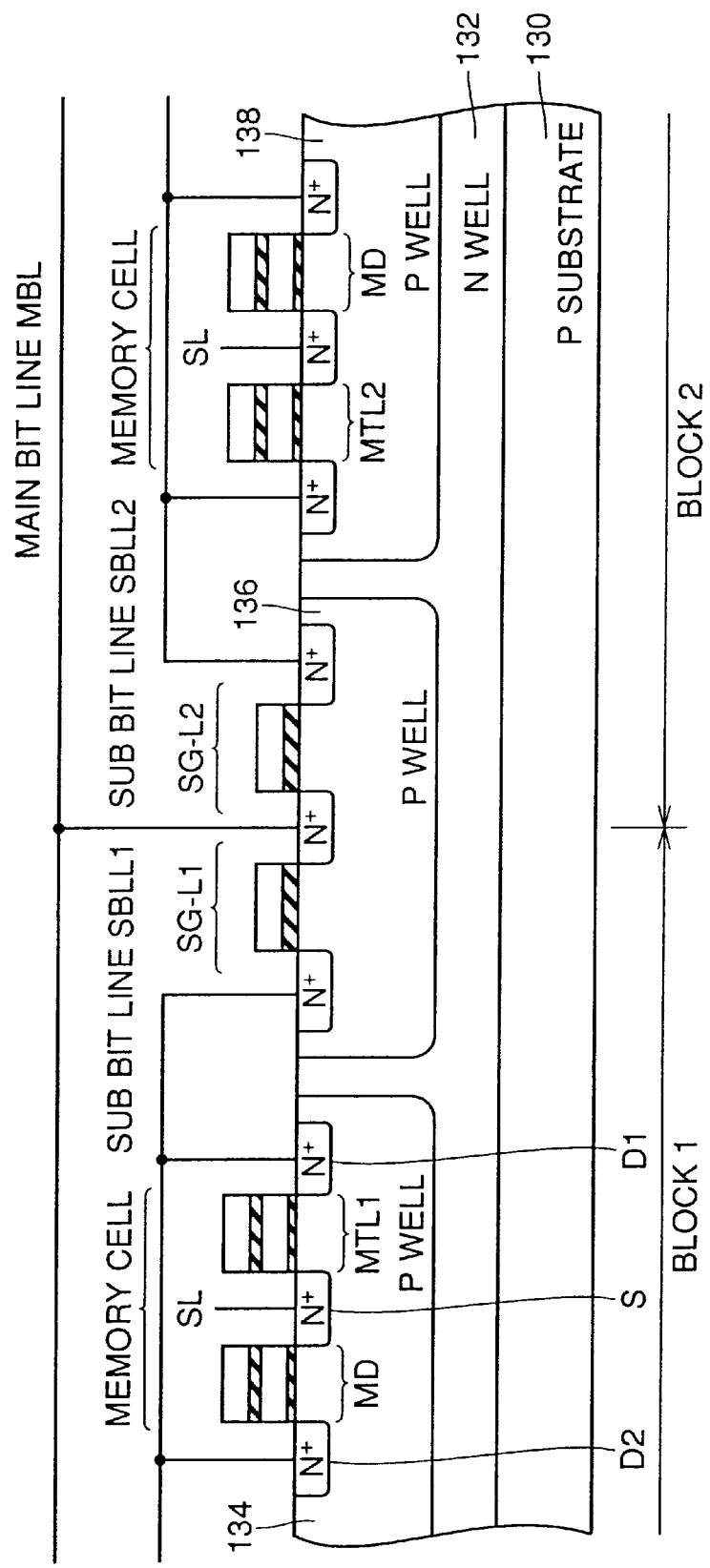
FIG. 16 is a section view showing a structure where the lock bit memory cell is provided within the same well as the memory cell for data storing.
Figure 17:
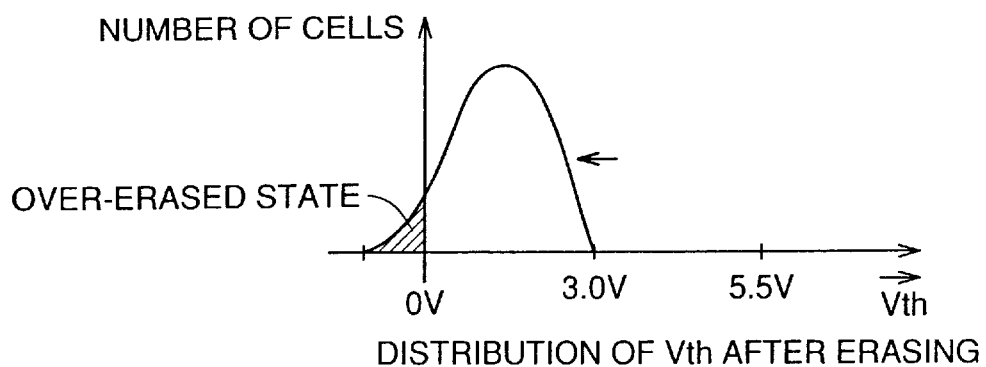
FIG. 17 illustrates an over-erased state.
Figure 18:
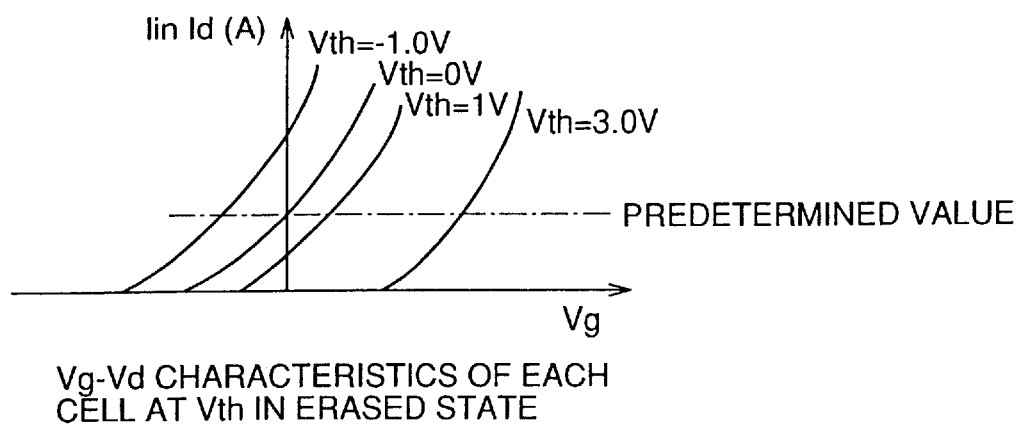
FIG. 18 illustrates characteristics of the gate voltage and the drain current of the memory transistor having different threshold voltages in the erased state.
Figure 19:
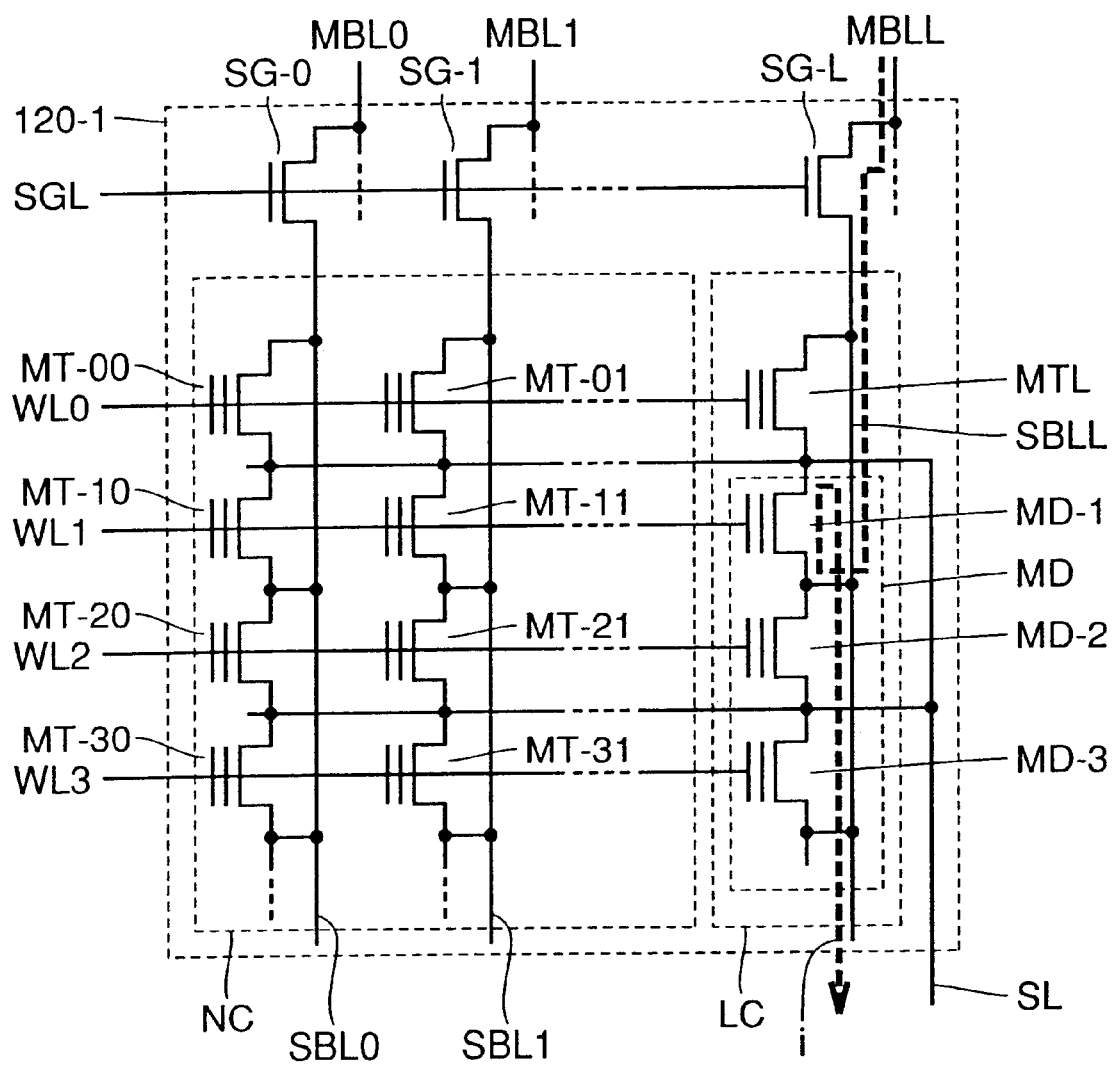
FIG. 19 is a circuit diagram illustrating a lock-bit reading error.

FIG. 8 is a section view illustrating a column including memory transistor MTL of memory block 70-1 shown in FIG. 7.

Referring to FIG. 8, though drain D2 of dummy cell MD-1a and drain D1 of memory transistor MTL are connected to a common sub bit line SBLL, the dummy cells MD-1a to MD-na are MOS transistors without floating gates.

Such configuration prevents the threshold voltage Vth of dummy cells MD-1a to MD-na from shifting even if an electric field is applied between the gate and the well/source at the time of collective erasing. Thus, when the gate potential of memory transistor MTL is activated and that of the dummy cells are inactivated, the dummy cell is in non-conductive state causing no reading error of lock bit.

As described above, the configuration shown in the third embodiment includes, as a dummy cell formed in the column of the lock bit cell, a field effect transistor without a floating gate. Thus, no variation occurs in the threshold voltage of the dummy cell at the time of collective erasing of the memory block, and the dummy cell can be prevented from being over erased. Therefore, the nonvolatile semiconductor memory device with increased reliability in lock-bit reading and advantageous operation time can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising memory blocks each as a unit for collectively performing an erasing operation, each of said memory blocks including
a plurality of normal memory cells arranged in matrix of normal rows and normal columns, holding normal data provided from an external source, and
a lock-bit cell column provided adjacent to at least any one of said normal columns, holding a lock bit forming permission information on programming and erasing for said memory blocks; and
said lock-bit cell column including
a first field effect transistor connected between a first internal node and a second internal node, having a first floating gate and holding said lock bit depending on a threshold voltage, and
a second field effect transistor having a second floating gate and connected between said second internal node and a third internal node electrically isolated from said first internal node.

2. The nonvolatile semiconductor memory device according to claim 1, wherein each of said memory blocks further includes a source line connected to said second internal node, and
a first bit line connected to said first internal node and provided corresponding to at least a part of said lock-bit cell column, said nonvolatile semiconductor memory device further comprises:
a decode circuit for activating a gate potential of said first field effect transistor and inactivating a gate potential of said second field effect transistor at the time of reading said lock bit; and
a sense amplifier for detecting said lock bit according to current flowing from said first bit line toward said source line.

3. The nonvolatile semiconductor memory device according to claim 2, wherein said plurality of normal memory cells are field effect transistors each having a floating gate;
each of said memory blocks further includes
a plurality of normal bit lines respectively provided corresponding to said normal columns, and
a plurality of word lines respectively provided corresponding to said normal rows; and
said plurality of normal memory cells included in each of said normal columns are connected in parallel with one another between a corresponding bit line of said plurality of normal bit lines and said source line, control gates thereof being connected to a corresponding word line of said plurality of word lines.

4. The nonvolatile semiconductor memory device according to claim 2, wherein said lock-bit cell column further includes a third field effect transistor connected between said second internal node and said third internal node; and each of said memory blocks further includes a second bit line connected to said third internal node and provided corresponding to a portion where said second and third field effect transistors of said lock-bit cell column are arranged.

5. The nonvolatile semiconductor memory device according to claim 1, wherein said nonvolatile semiconductor memory device is formed on a main surface of a semiconductor substrate;

said memory blocks are respectively formed within a plurality of wells of a first conductivity type formed on said main surface;

said first field effect transistor is an MOS transistor formed within that corresponding well of said plurality of wells which corresponds to each of said memory blocks, having, as source and drain, first and second impurity regions of a second conductivity type; and said second field effect transistor is an MOS transistor formed in said corresponding well having said first impurity region as source and a third impurity region of the second conductivity type as drain.

6. A nonvolatile semiconductor memory device comprising memory blocks each as a unit for collectively performing an erasing operation, each of said memory blocks including a plurality of normal memory cells arranged in matrix of normal rows and normal columns, holding normal data provided from an external source, a plurality of word lines respectively provided corresponding to said normal rows, and a lock-bit cell column provided adjacent to at least any one of said normal columns, holding a lock bit forming permission information on programming and erasing for said memory blocks;

said lock-bit cell column including first and second field effect transistors each having a control gate and a floating gate;

said first field effect transistor being connected between a first internal node and a second internal node and holding said lock bit depending on a threshold voltage, the control gate thereof being connected to any one of said plurality of word lines; and said second field effect transistor being connected in parallel with said first field effect transistor, the control gate thereof being connected to a third internal node having a potential which causes no extraction of electrons from said floating gate at the time of collective erasing of each of said memory blocks.

7. The nonvolatile semiconductor memory device according to claim 6, wherein each of said memory blocks further includes a source line connected to said second internal node, and a first bit line connected to said first internal node and provided corresponding to said lock-bit cell column; said nonvolatile semiconductor memory device further comprises:

a decode circuit for activating a word line connected to the control gate of said first field effect transistor at the time of reading said lock bit; and a sense amplifier for detecting said lock bit according to current flowing from said first bit line toward said source line.

8. The nonvolatile semiconductor memory device according to claim 7, wherein said third internal node is electrically isolated from said plurality of word lines.

9. The nonvolatile semiconductor memory device according to claim 7, wherein said plurality of normal memory cells are field effect transistors each having a control gate and a floating gate;

each of said memory blocks further includes a plurality of normal bit lines respectively provided corresponding to said normal columns; and said plurality of normal memory cells included in each of said normal columns are connected in parallel with one another between a corresponding bit line of said plurality of normal bit lines corresponding to said normal columns and said source line, the control gates thereof being respectively connected to corresponding word lines of said plurality of word lines.

10. The nonvolatile semiconductor memory device according to claim 6, wherein said nonvolatile semiconductor memory device is formed on a main surface of a semiconductor substrate;

said memory blocks are respectively formed within a plurality of wells of a first conductivity type formed on said main surface;

said first field effect transistor is an MOS transistor formed within that corresponding well of said plurality of wells which corresponds to each of said memory blocks, having, as source and drain, first and second impurity regions of a second conductivity type; and said second field effect transistor is an MOS transistor formed in said corresponding well having said first impurity region as source and a third impurity region of the second conductivity type as drain.

11. A nonvolatile semiconductor memory device comprising memory blocks each as a unit for collectively performing an erasing operation;

each of said memory blocks including a plurality of normal memory cells arranged in matrix of normal rows and normal columns, holding normal data provided from an external source, and a lock-bit cell column provided adjacent to at least any one of said normal columns, holding a lock bit forming permission information on programming and erasing for said memory blocks; and said lock-bit cell column including a first field effect transistor connected between a first internal node and a second internal node, having a floating gate and holding said lock bit depending on a threshold voltage, and a second field effect transistor without floating gate, connected in parallel with said first field effect transistor.

12. The nonvolatile semiconductor memory device according to claim 11, wherein each of said memory blocks includes a source line connected to said second internal node, a bit line connected to said first internal node, and a plurality of word lines respectively provided corresponding to said normal rows;

gate of said first field effect transistor is connected to a first word line of said plurality of word lines; and gate of said second field effect transistor is connected to a second word line of said plurality of word lines; said nonvolatile semiconductor memory device further comprises:

a word line decode circuit for activating said first word line and inactivating said second word line at the time of reading said lock bit; and a sense amplifier for detecting said lock bit according to current flowing from said bit line toward said source line.

13. The nonvolatile semiconductor memory device according to claim 12, wherein said plurality of normal memory cells are field effect transistors each having a control gate and a floating gate;

each of said memory blocks further includes a plurality of normal bit lines respectively provided corresponding to said normal columns; and said plurality of normal memory cells included in each of said normal columns are connected in parallel with one another between a corresponding bit line of said plurality of normal bit lines corresponding to said normal columns and said source line, control gates thereof being respectively connected to corresponding word lines of said plurality of word lines.

14. The nonvolatile semiconductor memory device according to claim 11, wherein:

said nonvolatile semiconductor memory device is formed on a main surface of a semiconductor substrate;

said memory blocks are respectively formed within a plurality of wells of a first conductivity type formed on said main surface;

said first field effect transistor is an MOS transistor formed within that corresponding well of said plurality of wells which corresponds to each of said memory blocks, having, as source and drain, first and second impurity regions of a second conductivity type; and said second field effect transistor is an MOS transistor formed in said corresponding well having said first impurity region as source and a third impurity region of the second conductivity type as drain.

15. A nonvolatile semiconductor memory device, comprising:

a plurality of first memory cells arranged in a matrix of a plurality of first columns and a plurality of first rows, holding data provided from an external source;

a plurality of first bit lines provided respectively corresponding to said plurality of first columns;

a second column provided adjacent to at least one of said plurality of first columns; and a second bit line provided corresponding to said second column, said second column including a second memory cell holding data provided from an external source, and a third memory cell set to be in a non-programmable state for data provided from an external source.

16. The nonvolatile semiconductor device according to claim 15, wherein said third memory cell is electrically separated from said second bit line, and said second memory cell is, when selected, electrically connected to said second bit line.

17. A nonvolatile semiconductor memory device, comprising memory blocks each of said memory blocks including a plurality of first memory cells arranged in a matrix of a plurality of first columns and a plurality of first rows, holding data provided from an external course, a second column provided adjacent to at least one of said plurality of first columns, and a second bit line provided corresponding to said second column, said second column including a second memory cell holding a lock bit provided from an external source, the lock bit forming permission information on programming and erasing for a corresponding one of said memory blocks, and a third memory cell set to be in a non-programmable state for data provided from an external source.

* * * * *